United States Patent
Loh et al.

(10) Patent No.: US 9,292,644 B2
(45) Date of Patent: Mar. 22, 2016

(54) ROW BASED ANALOG STANDARD CELL LAYOUT DESIGN AND METHODOLOGY

(76) Inventors: William Loh, Fremont, CA (US); Erik Vaclav Chmelar, Midland, MI (US)

( * ) Notice: Subject to any disclaimer, the term of this patent is extended or adjusted under 35 U.S.C. 154(b) by 0 days.

(21) Appl. No.: 13/572,697

(22) Filed: Aug. 13, 2012

(65) Prior Publication Data

US 2013/0042216 A1    Feb. 14, 2013

Related U.S. Application Data

(60) Provisional application No. 61/522,692, filed on Aug. 12, 2011.

(51) Int. Cl.
*G06F 17/50* (2006.01)

(52) U.S. Cl.
CPC ........ *G06F 17/5068* (2013.01); *G06F 17/5063* (2013.01)

(58) Field of Classification Search
CPC ............ G06F 17/5068; G06F 17/5063; G06F 17/5072; G06F 17/50; G06F 17/504; G06F 17/5045; G06F 17/505; G06F 2217/12; G06F 2217/66; H01L 27/0207; H01L 27/092
USPC ............................. 716/55, 101, 102, 104, 139
See application file for complete search history.

(56) References Cited

U.S. PATENT DOCUMENTS

| | | | |
|---|---|---|---|
| 5,302,864 A | 4/1994 | Shinbara | |
| 7,760,578 B2 | 7/2010 | Vinke et al. | |
| 2005/0193363 A1* | 9/2005 | Gupta et al. | 716/19 |
| 2008/0105929 A1* | 5/2008 | Eimitsu et al. | 257/390 |
| 2009/0064072 A1* | 3/2009 | Lin et al. | 716/8 |
| 2009/0101940 A1* | 4/2009 | Barrows et al. | 257/204 |
| 2010/0133589 A1* | 6/2010 | Aruga et al. | 257/206 |
| 2010/0162184 A1* | 6/2010 | Penzes | 716/1 |
| 2010/0162187 A1* | 6/2010 | Penzes et al. | 716/2 |
| 2012/0278781 A1* | 11/2012 | Wann et al. | 716/122 |
| 2012/0331426 A1* | 12/2012 | Lu et al. | 716/52 |
| 2013/0026572 A1* | 1/2013 | Kawa et al. | 257/347 |
| 2013/0140642 A1* | 6/2013 | Aruga et al. | 257/369 |
| 2013/0140707 A1* | 6/2013 | Misaka et al. | 257/773 |

OTHER PUBLICATIONS

R. Neff, Automatic Synthesis of CMOS Digital/Analog Converters, PhD Dissertation, UC Berkeley, 1995, pp. 1-179.

* cited by examiner

*Primary Examiner* — Nha Nguyen
(74) *Attorney, Agent, or Firm* — Erik Chmelar

(57) ABSTRACT

A system and method of designing the physical layout of an SoC incorporating row-based placement of analog standard cells whose heights are constrained to a predetermined row height or integer multiple thereof. A library of analog standard cells may be utilized by an ECAD tool to map, place, and route analog and mixed signal circuits in a manner similar to how such ECAD tool may utilize a library of digital standard cells to map, place, and route digital circuits. Mapping, placing, and routing of digital, analog, and mixed signal circuits may proceed within a unified ECAD SoC physical design flow. Finally, a general type analog standard cell is taught to further increase the speed and efficiency of analog and mixed-signal SoC layout.

18 Claims, 9 Drawing Sheets

ROW BASED ANALOG STANDARD CELL LAYOUT DESIGN AND METHODOLOGY

CROSS-REFERENCE TO RELATED APPLICATIONS

This application claims the benefit of U.S. Provisional Patent Application No. 61/522,692, filed Aug. 12, 2011, by applicant William Loh.

BACKGROUND OF THE INVENTION

The present invention relates generally to Electronic Computer-Aided Design (ECAD). More specifically, it pertains to a system and methodology of using analog standard cells, and an analog standard cell library, in a System-on-Chip (SoC) physical design environment. What is taught is a definition of both general and specialized analog standard cells that permit the physical layout of analog and mixed-signal SoCs to be designed quickly and efficiently using ECAD tools.

While the term analog standard cells exists in prior art, prior art does not define analog standard cells in a manner that accords them significant utility in designing the physical layout of analog or mixed-signal SoCs. Specifically, prior art has not taught analog standard cells comprising relatively simple functions, predetermined cell heights, inclusion in a library of analog standard cells, and utilization by ECAD tools to enable the fast and efficient layout of relatively complicated functions out of such relatively simple analog standard cells. Furthermore, prior art does not describe, in part or in whole, a general analog standard cell as is taught as one feature of the present invention.

A common methodology of designing analog and mixed-signal SoCs is to use pcells. A pcell, short for parametric cell, is an analog circuit cell that has one or more parameters that may be varied within a specified range by a designer. For example, a simple pcell is a single-transistor cell, which may have as exemplary variable parameters the contact spacing or diffusion width. This enables a very flexible analog cell that may be used as a building block for more complex analog circuits in an SoC. However, because it is advantageous to maximize analog circuit performance by minimizing layout area, routing, parasitics, etc., varying such parameters in a pcell typically alters its overall dimensions. Such fine-grain variation of a pcell's outside dimensions generally results in pcells whose heights are not integer multiples of each other. For example, a first pcell may have a height of 1 unit and a second pcell may have a height of 1.13 units—such heights obviously not integer multiples of each other. This is in contrast to integer-multiple heights, for example a first pcell with height of 1 unit and a second pcell with height of 2 units.

Pcells with such non-integer-multiple dimensions (variable width and/or height) are extremely difficult to efficiently place within an SoC physical design. Most significantly, the non-integer-multiple pcell heights preclude pcells from being placed-and-routed by ECAD tools, which rely on fixed-height or integer-multiple-height cells.

Accordingly, what is desired, and has not heretofore been developed, is a system and methodology to layout the physical design of analog and mixed-signal SoCs rapidly and efficiently using ECAD tools. In the subsequent sections it will be shown how the specific definition of analog standard cells, the various exemplary types of analog standard cells, and the analog standard cell library enables such rapid and efficient layout of SoCs physical designs using ECAD tools.

Terminology used in this application, unless otherwise defined, shall derive its meaning within the scope and context accorded by the fields of ECAD, Very Large Scale Integration (VLSI), analog-, digital-, and mixed-signal circuit design, and the like.

BRIEF SUMMARY OF THE INVENTION

The following summarizes many of the notable objects of the present invention, which permit practically seamless and transparent inclusion of analog standard cells into the ECAD physical design environment to enable fast and efficient layout of analog and mixed-signal SoCs:

provide analog standard cells of one or more specified heights;

provide analog standard cells of one or more specified heights corresponding to the row height, or integer multiples thereof, of typical digital standard cells;

provide analog standard cells that may individually implement relatively simple functions;

provide analog standard cells that may collectively implement relatively complex functions;

provide one or more general type analog standard cells; and provide a library of analog standard cells that may include, but is not limited to, general types, differential pairs, moscaps, varactors, resistors, current sources, current minors, well-taps, and ESD devices.

DETAILED DESCRIPTION OF THE INVENTION

Figure 1:
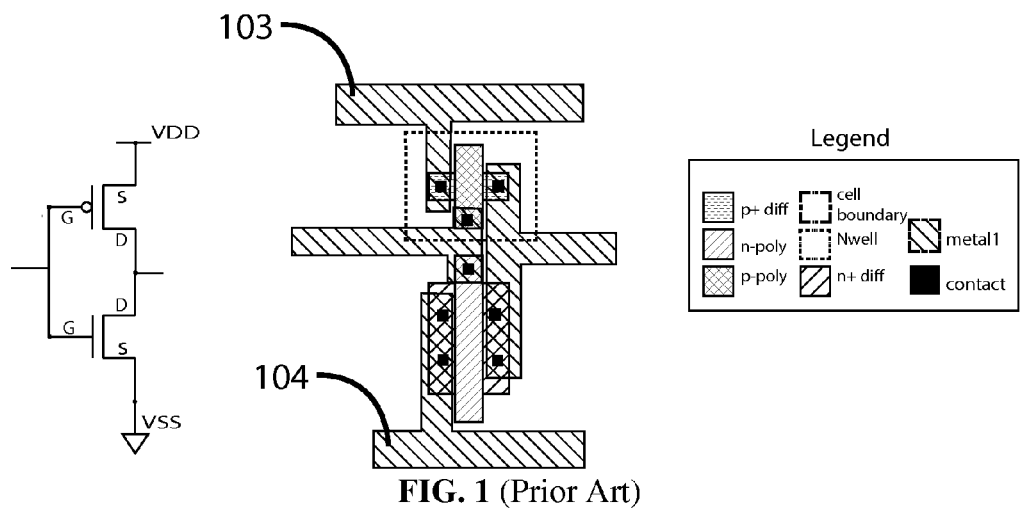
FIG. 1 shows an exemplary digital standard cell, an inverter, drawn as a transistor-level schematic on the left and as a layout-level (physical design) schematic on the right.

One major aspect of the well established methodology of designing SoCs is to utilize a library of digital standard cells to layout the physical design. A digital standard cell is generally comprised of a few transistors that perform some logic function. The logic function is typically elementary or simple, for example a logical AND function, a logical OR function, and so on. The left side of FIG. 1 shows an typical CMOS inverter (logical NOT function) and the right side of FIG. 1 shows a corresponding digital standard cell with connections made to the VDD and VSS power rails. By interconnecting the inputs and outputs of multiple digital standard cells, more complex logic functions can be created, thereby forming building blocks of an SoC physical design.

ECAD tools are used to select standard cells from a library, map the circuitry of an SoC design to standard cells, place standard cells, and route (interconnect) standard cells to create the physical design (the layout). Heretofore and henceforth the term ECAD tool is ascribed the meaning common in the art; however, it may, for example, comprise multiple software programs or scripts from different sources or vendors. Heretofore and henceforth the term SoC design defines any system of circuits that may be described by any suitable means, for example a gate-level netlist or an RTL netlist. Heretofore and henceforth the term physical design is ascribed the meaning common in the art. Heretofore and henceforth the term layout, when a verb, means the transformation of an SoC design to a physical design, and when not a verb, is synonymous with the term 'physical design.'

ECAD tools generally place and route standard cells based on some predefined constraints, such as the timing of electrical signals between standard cells or minimization of layout area. Placement refers to the physical positioning of a standard cell within an SoC layout and routing refers to the determination of conductive interconnects between such cells. Modern ECAD tools are very efficient in place and route operations, which has resulted in an enormous productivity boost in the physical design flow of digital SoCs. A billion-transistor SoC design may be laid out using this ECAD-based standard cell methodology within a few months. Whereas digital designer productivity is currently measured in millions of transistors placed per day, state-of-the-art analog designer productivity is currently measured in only tens of transistors per day. This orders-of-magnitude productivity gap is the direct result of decades of advancements made in the place-and-route efficiency of ECAD tools.

Figure 2:
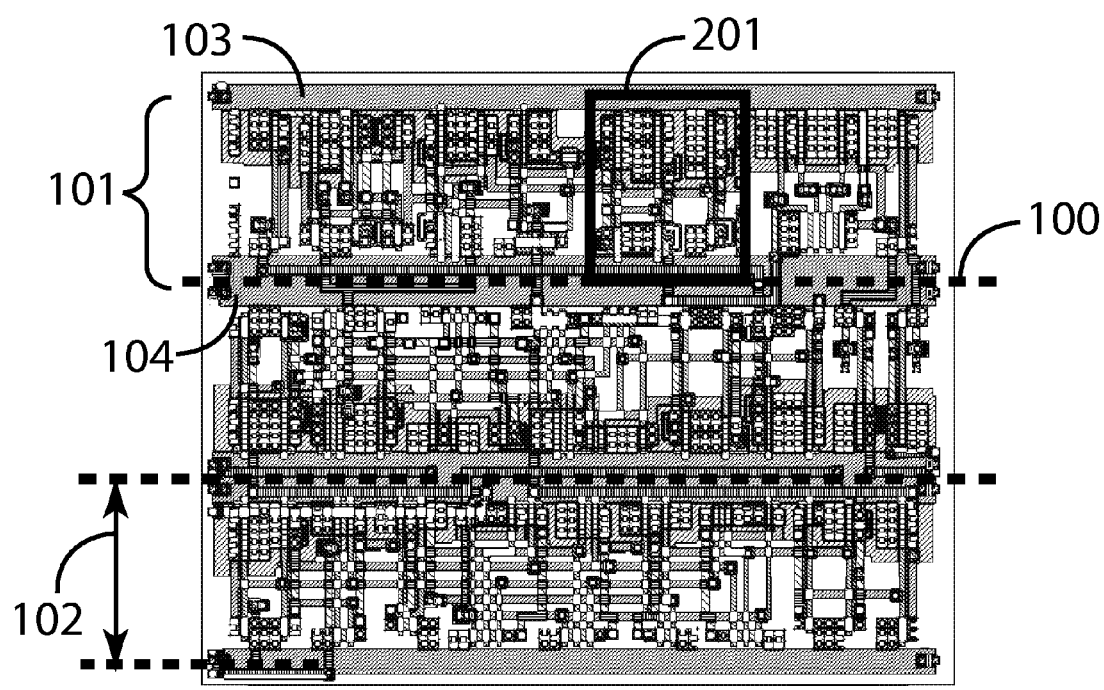
FIG. 2 shows an exemplary two-dimensional row-based grid system that is common in the SoC design environment, and the placement of a number of digital standard cells therein.

ECAD tools generally place standard cells in an SoC physical design based on a two-dimensional row-based grid 100 as shown in FIG. 2. Each row 101 within the grid 100 are traditionally oriented horizontally and considered to have a predetermined row height 102 (the same grid-based layout concept applies equally to a fixed-width column-based grid). At the row 101 boundaries may be routed a VDD power rail 103 and a VSS power rail 104, which is typically done using a metal layer such as metal 1 or metal 2. A placed standard cell is appropriately connected to such VDD power rail 103 and VSS power rail 104 to provide power to the cell, as was shown in FIG. 1.

Figure 3:
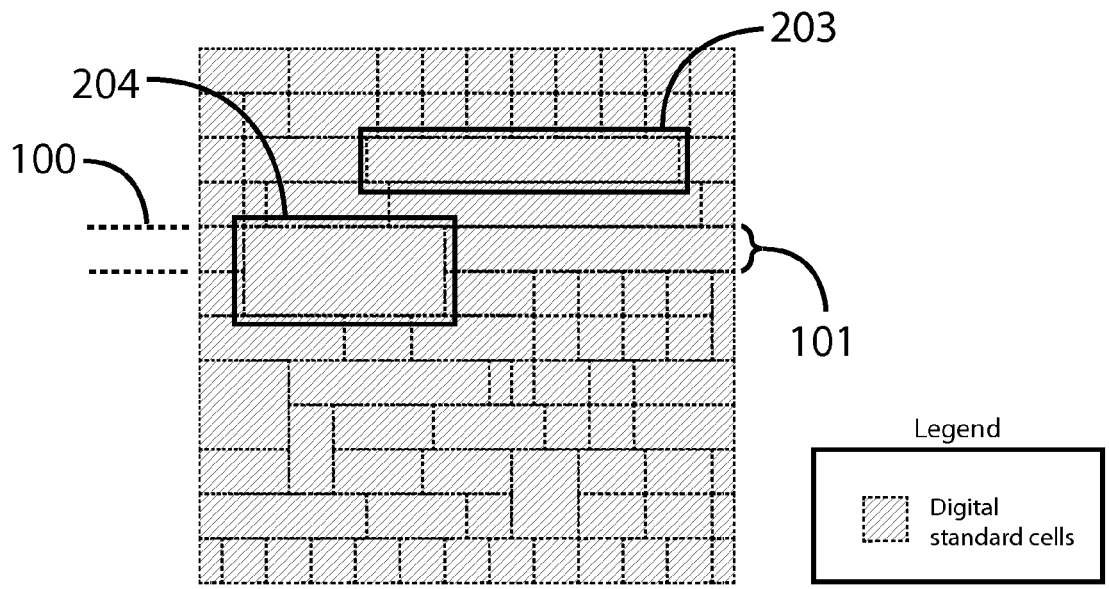
FIG. 3 shows an exemplary two-dimensional row-based grid system of a digital SoC in which row-height and integer-multiple row-height digital standard cells are placed.

While the standard cells within a library may have varying (typically integer-multiple) physical height dimensions, a critical element to ECAD tools' efficiency has been for an ECAD tool to select from a library only standard cells with the same height dimension for placement within a particular row. This constraint greatly reduces the complexity of the physical design space and makes the placement and routing of an enormous number of cells possible. An example of multiple digital standard cells 201 placed within rows 101 of a grid 100 is shown in FIG. 3.

This row-based placement methodology does not necessarily mean that all the rows of the SoC are of the same height, although in practice this is almost always the case. As long as the standard cells can fit into an integer-multiple of the grid row height, the constraint is not violated. FIG. 3 shows an exemplary placement of single-row digital cells 203 and double-row digital cells 204 within the rows 101 of a grid 100.

Figure 4:
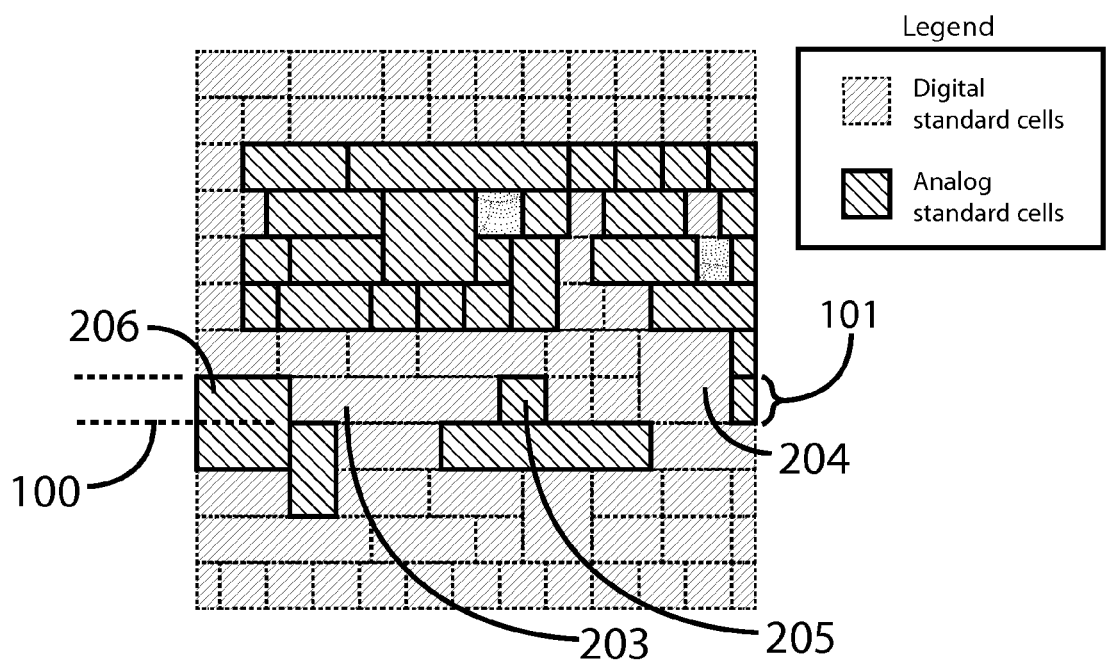
FIG. 4 shows an exemplary two-dimensional row-based grid system of a mixed-signal SoC in which row-height and integer-multiple row-height digital standard cells, and row-height and integer-multiple row-height analog standard cells, are placed.

The present invention teaches the same constraint of fixed-row height for analog standard cells as that just described for digital standard cells. Consequently, because both digital and analog standard cells are similarly constrained by row height, there is no substantial distinction between digital standard cells and analog standard cells in the ECAD design environment—both may be placed and routed according to similar constraint-based metrics, for example timing of electrical signals between standard cells or minimization of layout area. An ECAD tool can place both types of cells in any suitably distributed manner rather than the current state-of-the-art practice of placing digital cells in one area of the SoC layout and analog cells in another. FIG. 4 shows an example of this flexible placement methodology wherein single-row digital cells 203, single-row analog cells 205, double-row digital cells 204, and double-row analog cells 206 are distributed within the rows 101 of a grid 100.

In contrast to the non-integer variable height pcell SoC design methodology previously described, the present invention teaches a library of fixed-height and/or integer-multiple height analog standard cells. Heretofore and henceforth the term fixed height is used to describe a cell height that equals a row height or integer multiple thereof.

Also, unlike the designer-adjustable parameters of a pcell, each analog standard cell has a fixed set of parameters and thus a fixed layout. Fixing the layout parameters of an analog standard cell gives such cell a specific function, which can be as simple as the gating function of a single transistor or a more complex function like that of a current source. The library may contain many analog standard cells of a particular type, for example multiple current source analog standard cells with differing parameters, for example different current drive strengths. In other words, there may be a family of current source analog standard cells within a library. Heretofore and henceforth the term analog standard cell type, and related variants thereof, is used to describe a family of analog standard cells of the specified type, wherein a family may have zero or more members.

The utility of an analog standard cell library may be defined in part by the ability, efficiency, and speed that an ECAD tool can select, place, and route analog standard cells from such library to design an analog or mixed-signal SoC. Generally, a library containing more types of analog standard cells, and with more parametric variations of a particular type of analog standard cell, has greater utility. Examples of analog standard cell types of a library may include, but are not limited to, general types, differential pairs, moscaps, varactors, resistors, current sources, current mirrors, well-taps, and ESD devices. With the exception of the general type, which will be described shortly, the names of these exemplary types of analog standard cells imply corresponding analog functions and physical layouts that are well-known in the art. Thus, these non-general analog standard cell examples will not be detailed further, with the exception of a brief layout-level description of an exemplary differential pair (FIG. 6a and FIG. 6b) and an exemplary pass gate (FIG. 7a and FIG. 7b).

The general type analog standard cell is a family of cells that may implement NMOS and PMOS transistors of differing parameters. Heretofore and henceforth, the term parameter, when applied to analog standard cells, is used generally to mean any parameter or feature that may alter some property of the cell. Increasing the effective channel width or length of a transistor within a standard cell is an example parametric variation that yields a readily observable property variation—transistor drive strength. Duplicating (doubling-up) one or more vias within a cell is an example parametric variation that yields a less readily observable property variation—manufacturing yield (Design for Manufacturing (DFM)). Other general type analog standard cell parameters that may be varied include, but are not limited to, contacts on both sides of poly fingers, non-uniform sizes and/or spacing of poly fingers, non-vertically aligned n-type poly fingers to p-type poly fingers, number of contacts to diffusion regions, spacing between diffusion regions, and metal line widths.

Figure 5A:
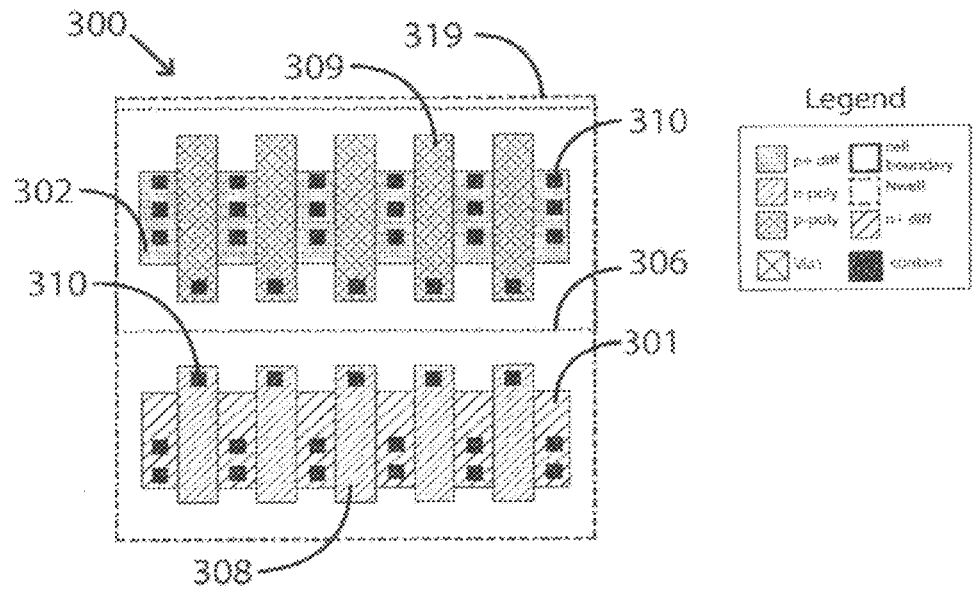
FIG. 5a shows the preliminary layout-level structure of an exemplary general type analog standard cell prior to metalization and FIG. 5b shows an exemplary layout-level analog standard cell of that exemplary general type analog standard cell after metalization.

FIG. 5a shows an exemplary layout-level, partially implemented general cell 300 in which the parameter to be varied is effective channel width of an NMOS transistor and effective channel width of a PMOS transistor (varied independently), each of which alters each transistor's drive strength property. Within its cell boundary 319 is included an nwell 306, a p-type diffusion 302, and an n-type diffusion 301. Alternatively or in addition, multiple n-type and p-type wells may be included depending on the fabrication process used to manufacture the SoC, for example if the n-type or p-type substrate is used. For this particular example, there are a maximum of 5 NMOS fingers 308 spanning the n-type diffusion 301 and 5 PMOS fingers 309 spanning the p-type diffusion 302. Alternatively, the general cell 300 may be implemented with more or less total fingers, and the number of NMOS fingers 308 need not be equal to the number of PMOS fingers 309.

The NMOS and PMOS transistors of the exemplary partially implemented general cell 300 of FIG. 5a can each assume a variable effective channel width, in normalized units, of 0, 1, 2, 3, 4, or 5. Consequently, a library containing this exemplary 5-NMOS-finger and 5-PMOS-finger general type analog standard cell may include cells with NMOS and PMOS transistors of effective channel widths, respectively and in arbitrary units, of '0 and 1', '0 and 2', '0 and 3', '0 and 4', '0 and 5', '1 and 0', '1 and 1', '1 and 2', and so on up to '5 and 5'. Excluding the '0 and 0' cell there are 35 such exemplary 5-NMOS-finger and 5-PMOS-finger general type analog standard cells that could be included in the library. In general, excluding the 0-width NMOS and 0-width PMOS configuration ('0 and 0'), a general cell 300 with N NMOS fingers and P PMOS fingers has N×P−1 possible configurations.

Figure 5B:
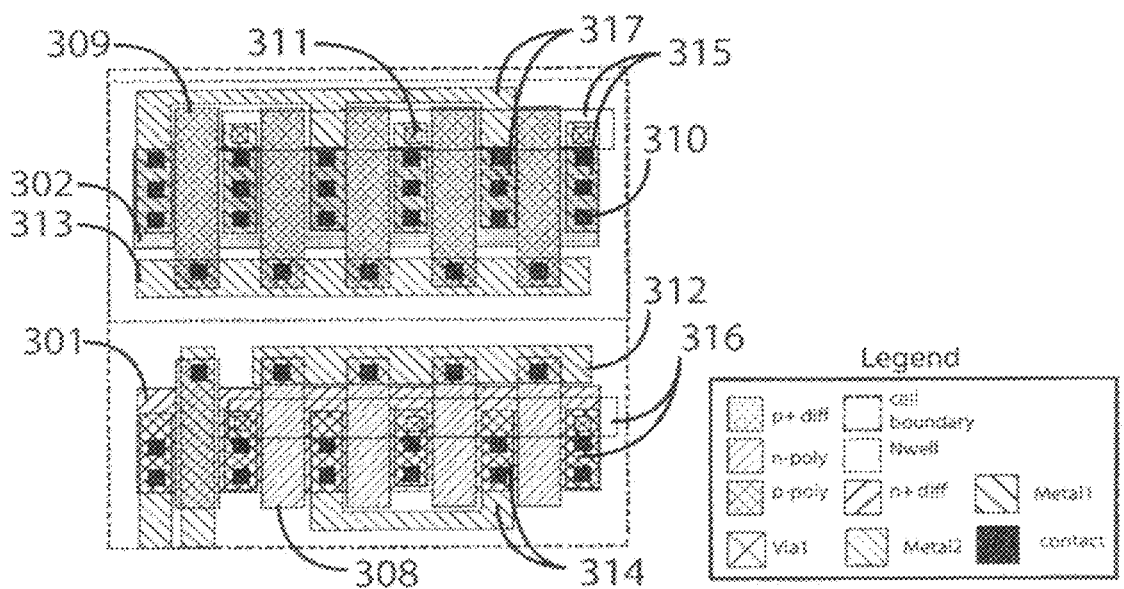

FIG. 5b shows one specific, fully implemented example of the exemplary 5-NMOS-finger and 5-PMOS-finger general type analog standard cell after metalization. This cell is configured with a 4-width NMOS transistor and a 5-width PMOS transistor ('4 and 5'), again in arbitrary units. The PMOS transistor is implemented with a PMOS gate 313 of 5 PMOS fingers 309 that are joined through a plurality of contacts 310 to an arbitrary metal layer 318, a PMOS drain 317 formed by joining 3 of the 6 p-type diffusions 302 through a plurality of contacts 310 to an arbitrary metal layer 318, and a PMOS source 315 formed by joining the remaining 3 unconnected p-type diffusions 302 through a plurality of contacts 310 and vias 311 to an arbitrary metal layer 318. Similarly, the NMOS transistor is implemented with an NMOS gate 312 of 4 NMOS fingers 308 that are joined through a plurality of contacts 310 to an arbitrary metal layer 318, an NMOS source 314 formed by joining 2 of the 6 n-type diffusions 301 through a plurality of contacts 310 to an arbitrary metal layer 318, and an NMOS drain 316 formed by joining 3 of the remaining 4 unconnected n-type diffusions 301 through a plurality of contacts 310 and vias 311 to an arbitrary metal layer 318. The unused NMOS finger 308 and unused n-type diffusion 301 are each joined to additional an arbitrary metal layers 318 through one or more contacts 310 so that they may be connected to the VSS power rail 104 during power and ground routing of the SoC. Heretofore and henceforth, each figure description in which one or more arbitrary metal layers are referenced, the use of the same feature number designation in the corresponding figure does not imply any electrical connection between those referenced arbitrary metal layer regions. Furthermore, different arbitrary metal layers may correspond to the same or different fabricated metal layers in an SoC.

The dimensions of the various elements of the general cell 300 of FIG. 5b are drawn as example only and are not intended to restrict the scope of the present invention. Specifically, PMOS fingers 309 need not be of equal length or width to other NMOS fingers 308 or to the PMOS fingers 309, PMOS fingers 309 need not be of equal length or width to other PMOS fingers 309 or to the NMOS fingers 308, p-type diffusions 302 need not be of equal length or width to other p-type diffusions 302 or to the n-type diffusions 301, and n-type diffusions 301 need not be of equal length or width to other n-type diffusions 301 or to the p-type diffusions 302. Furthermore, the number and locations of contacts 310 and vias 311 may be varied. Finally, the specific types of interconnects need not be the same as those suggested by the legends of FIG. 5a and FIG. 5b. Any other variations in layout, features, quantities, or geometries not mentioned also fall within the scope of the general cell 300.

The maximum number of NMOS fingers 308 and PMOS fingers 309 within a general cell 300 family of a library may be determined by any suitable criteria that maximizes the cells' utility as building blocks within a library to implement more complex analog functions that may be present in SoCs. However, if a transistor with a particular effective channel width is required in an SoC, but the library contains no analog standard cell that implements such transistor, available cells within the library may be appropriately interconnected to form such transistor. For example, if a library only contains analog standard cells with effective channel widths of 16, 8, 4, 2, and 1 (in arbitrary units), but a transistor with effective channel width of 21 is required, the cells with transistors having effective channels widths of 16, 4, and 1 may be placed adjacent to each other and interconnected (routed) appropriately to form the required 21-width transistor. Specifically, the 16-, 4-, and 1-width transistors would be interconnected in parallel by joining their gates, joining their sources, and joining their drains. This task is generally accomplished by ECAD tools. Finally, macro cells may be defined and used to streamline the mapping, placement, and routing of an SoC physical design layout. If, for example, an SoC design contains many 21-width transistors and none exist in the library, a 16+4+1=21-width transistor macro cell could be created (or 8+8+4+1=21-width, 8+4+2+2+2+2+1=21-width, etc.).

The general cell 300 as just described can have at most one NMOS transistor and at most one PMOS transistor. However, an exception to this can be achieved using the well known technique of drain/source sharing that is commonly used to reduce layout area and parasitic capacitance. Drain/source sharing is when the drain node of an NMOS transistor is connected to the source node of a second NMOS transistor, or alternatively when the drain node of a PMOS transistor is connected to the source node of a second PMOS transistor. Drain/source sharing, and thus multiple NMOS or multiple PMOS transistors, may be achieved within a single general cell 300. For example, to achieve two NMOS transistors, consider general cell 300 of N=N1+N2 NMOS fingers 308; a first NMOS transistors could have up to N1 NMOS fingers 308 and a second NMOS transistor could have up to N2 NMOS fingers 308. The first NMOS transistor comprises an adjacent pair of NMOS fingers 308 from the N1 group and the second transistor comprises an adjacent pair of NMOS fingers 308 from the N2 group, where both pairs are adjacent to each other as well. The n-type diffusion 301 in between the first and second pairs of NMOS fingers 308 can now form the shared source/drain—it is the source of the first transistor and the drain of the second transistor. Additional NMOS fingers 308 can be incorporated into each NMOS transistor by continuing the same selection of alternating adjacent pairs of NMOS fingers 308 from the two groups as just described. Connection between the corresponding transistor source and drain may be achieved using some conductive segment, for example metal or poly, thereby completing the source/drain shared transistor pair. The same method applies equally to PMOS transistors.

Furthermore, instead of using a general cell 300 to implement source/drain sharing, a source/drain-shared type analog standard cell may be defined as a special type of analog standard cell, just as a moscap type or varactor type analog standard cell is defined. Such source/drain-shared type analog standard cell would differ from the general cell 300 in that it would only include the diffusion and poly fingers necessary to implement NMOS or PMOS transistors, but not both. In other words, a source/drain-shared type analog standard cell can be considered a subset of a general cell 300, such subset being either the 'top' PMOS portion of the general cell 300 or the 'bottom' NMOS portion of the general cell 300.

Figure 6A:
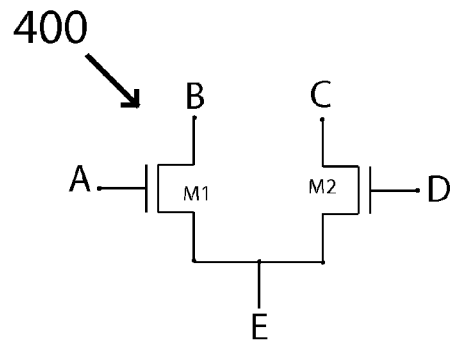
FIG. 6a shows an exemplary transistor-level differential pair circuit and FIG. 6b shows a corresponding exemplary layout-level analog standard cell.
Figure 6B:
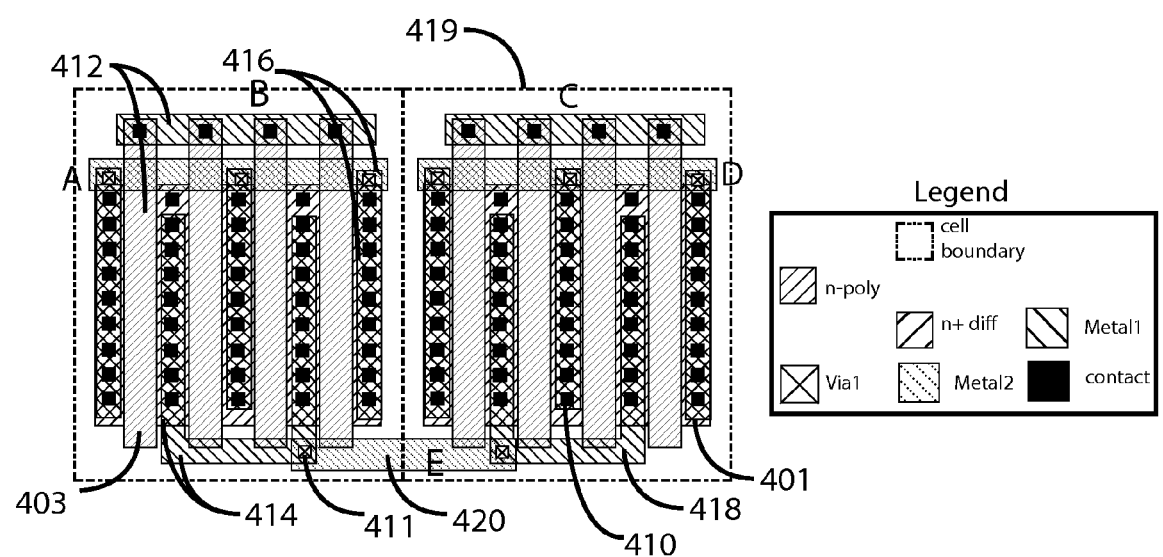
Figure 7A:
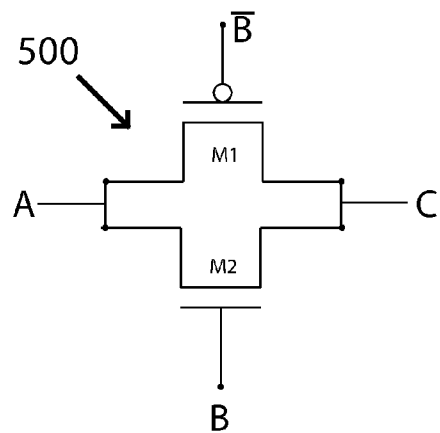
FIG. 7a shows an exemplary transistor-level pass gate circuit and FIG. 7b shows a corresponding exemplary layout-level analog standard cell implemented using a single general type analog standard cell.
Figure 7B:
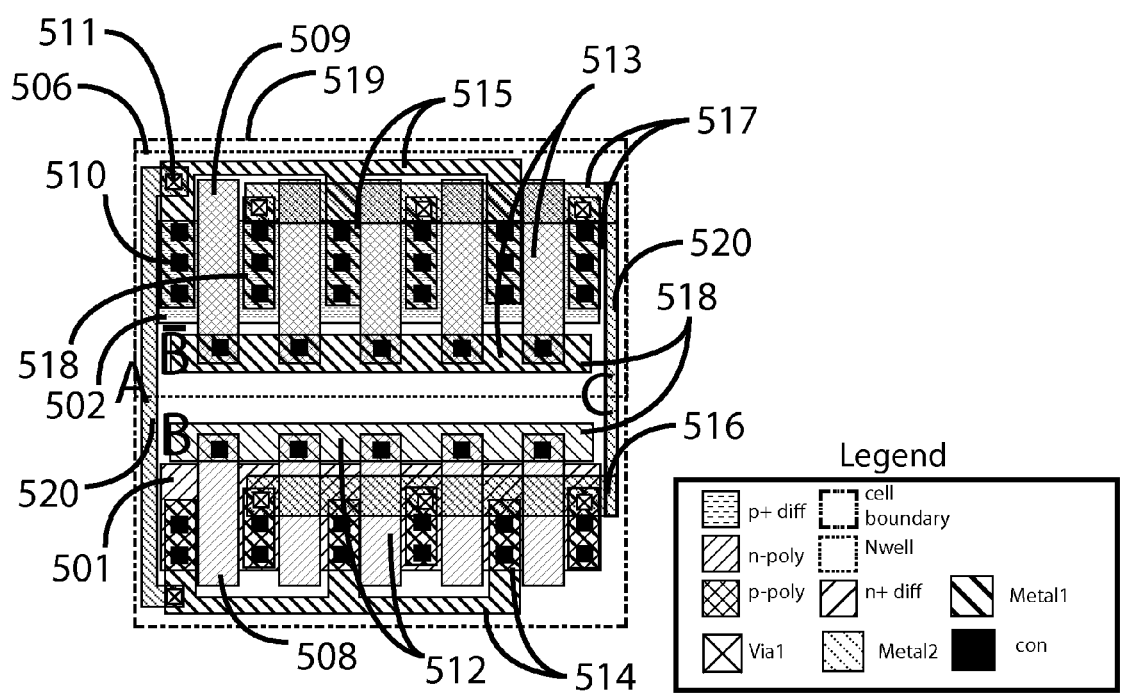

FIG. 6a shows a typical analog circuit, an NMOS transistor differential pair, consisting of two NMOS transistors connected in parallel as shown. The general layout-level implementation of such an NMOS differential pair is well known in the art, and will only be described briefly. The notable difference, however, between prior art implementations and those of the present invention is the restriction of the cell height to a standard row height or integer multiple thereof. FIG. 6b shows an exemplary analog standard cell layout-level implementation of the differential pair of FIG. 6a. Within its cell boundary 419 are shown 2 n-type diffusions 401, 2 NMOS gates 412, n-type poly 403, NMOS sources 414, 2 PMOS sources 415, 2 NMOS drains 416, and 2 PMOS drains 417. An arbitrary first metal layer 418 joins the 4 NMOS fingers 408 of each NMOS gate 412 using a plurality of contacts 410. An arbitrary first metal layer 418 makes contact with the left n-type diffusion 401 through a plurality of contacts 410 to form the left NMOS source 414; an arbitrary first metal layer 418 makes contact with the right n-type diffusion 401 through a plurality of contacts 410 to form the right NMOS source 414. The 2 NMOS sources 414 are joined with an arbitrary first metal layer 418 using a plurality of vias 411. An arbitrary first metal layer 418 makes contact with the left n-type diffusion 401 through a plurality of contacts 410, and that arbitrary first metal layer 418 is joined by another arbitrary second metal layer 420 using a plurality of vias 411, to form the left NMOS drain 416; an arbitrary first metal layer 418 makes contact with the right n-type diffusion 401 through a plurality of contacts 410, and that arbitrary first metal layer 418 is joined by another arbitrary second metal layer 420 using a plurality of vias 411, to form the right NMOS drain 416.

FIG. 7a shows another typical analog circuit, a pass gate, consisting of one NMOS transistor and one PMOS transistor connected in parallel as shown. The general layout-level implementation of such a pass gate is well known in the art, and will only be described briefly. The notable difference, however, between prior art implementations and those of the present invention is the restriction of the cell height to a standard row height or integer multiple thereof. FIG. 7b shows an exemplary analog standard cell layout-level implementation of the passgate cell 500 of FIG. 7a. Within its cell boundary 519 are shown an nwell 506, an n-type diffusion 501, a p-type diffusion 502, an NMOS gate 512, a PMOS gate 513, an NMOS source 514, a PMOS source 515, an NMOS drain 516, and a PMOS drain 517. An arbitrary first metal layer 518 joins the 5 PMOS fingers 509 of the PMOS gate 513 using a plurality of contacts 510; an arbitrary first metal layer 518 joins the 5 NMOS fingers 508 of the NMOS gate 512 using a plurality of contacts 510. An arbitrary first metal layer 518 makes contact with the p-type diffusion 502 through a plurality of contacts 510 to form the PMOS source 515; an arbitrary first metal layer 518 makes contact with the n-type diffusion 501 through a plurality of contacts 510 to form the NMOS source 514. An arbitrary first metal layer 518 makes contact with the p-type diffusion 502 through a plurality of contacts 510 to form the PMOS drain 517; an arbitrary first metal layer 518 makes contact with the n-type diffusion 501 through a plurality of contacts 510 to form the NMOS drain 516. The NMOS source 514 and PMOS drain 517 are joined with an arbitrary second metal layers 520 using a plurality of vias 511; the NMOS drain 516 and PMOS source 515 are joined with an arbitrary second metal layers 520 using a plurality of vias 511.

Figure 8A:
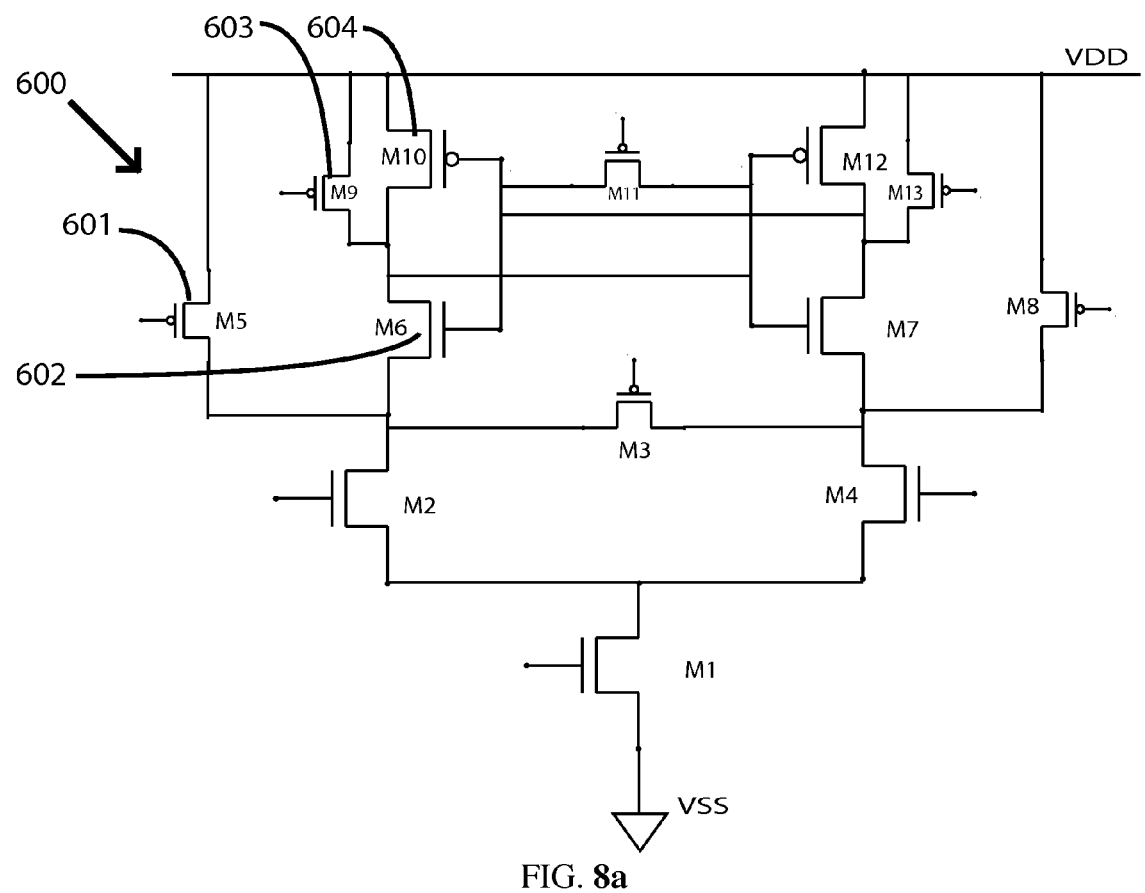
FIG. 8a shows an exemplary transistor-level comparator circuit.
Figure 8B:
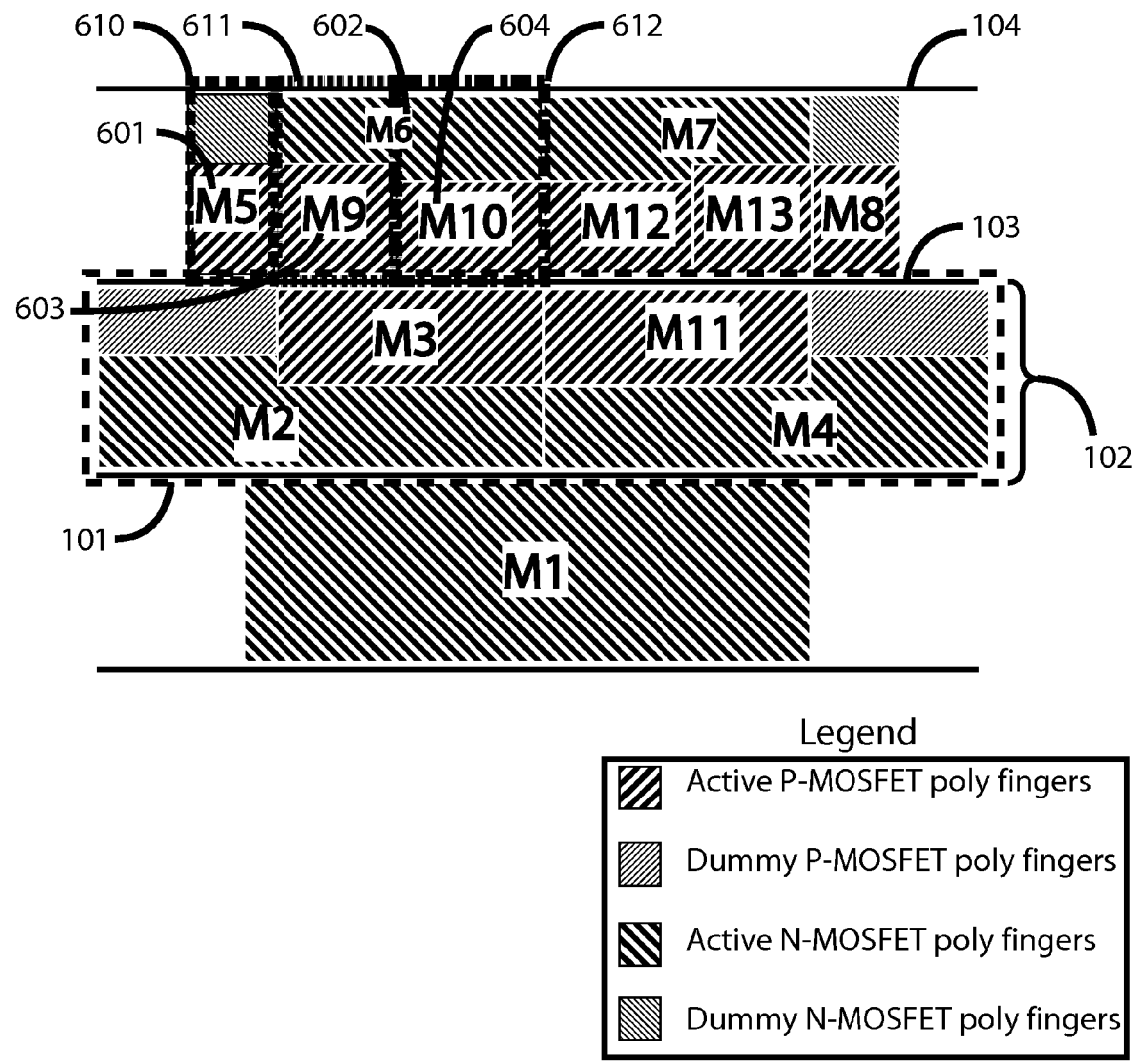
FIG. 8b shows an exemplary mapping and placement of analog standard cells of the comparator circuit.
Figure 8C:
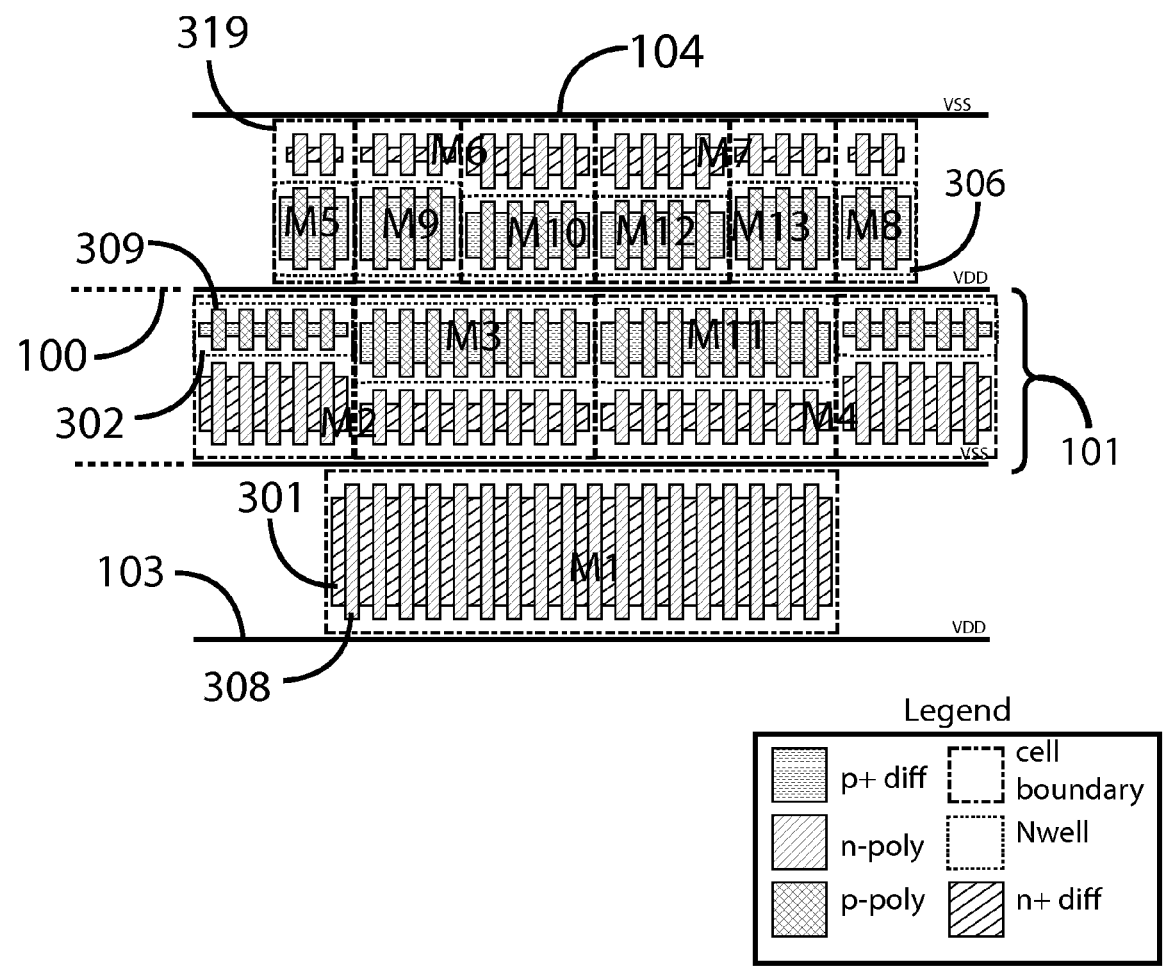
FIG. 8c shows an exemplary detailed view of the mapped and placed comparator circuit.

The utility of the present invention—the library of analog standard cells with heights corresponding to an SoC row height or integer multiples thereof—can be illustrated by the following example. FIG. 8a shows a typical analog circuit, a comparator, consisting of a plurality of NMOS transistors and a plurality of PMOS transistors connected as shown. FIG. 8b shows an exemplary mapping and placement of the circuit determined by an ECAD tool. For example, transistor M5 601 has been mapped to analog standard cell 610, part of transistor M6 602 and all of transistor M9 603 have been mapped to analog standard cell 611, and the remainder of transistor M6 602 and all of transistor M10 604 have been mapped to analog standard cell 612. This illustrates a very important feature of the present invention: a single transistor's layout may be achieved by combining multiple analog standard cells. In this example the layout of transistor M6 602 is achieved by utilizing two general type analog standard cells. FIG. 8c shows an exemplary detailed view of the mapped and placed comparator circuit of FIG. 8b excluding necessary contact, via, and metal layers that would otherwise obscure the layout details that are intended to be the focus of the figure.

Figure 9:
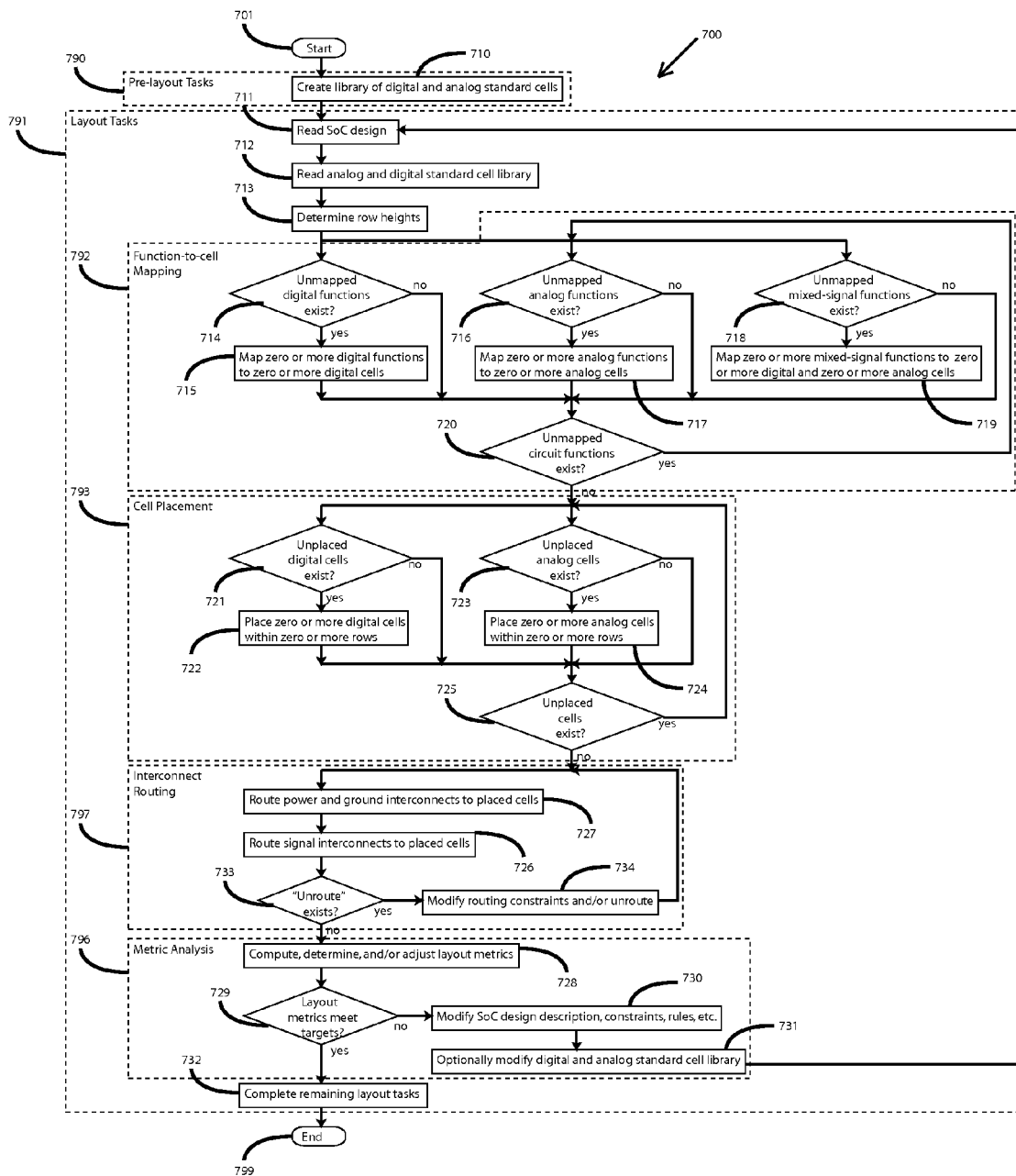
FIG. 9 shows an exemplary ECAD physical design flow that utilizes a library of analog standard cells to quickly and efficiently layout the majority of the physical design of an analog or mixed-signal SoC.

It is well known in the art how ECAD tools may read, map, place, and route an SoC design to generate the physical layout of an SoC. The utility of the present invention is that analog standard cells may be incorporated into an existing ECAD physical design flow practically seamlessly and transparently, in other words, with relatively simple modification. FIG. 9 shows the process by which a physical design layout may be generated from an SoC design using ECAD tools from start 701 to end 799. Some SoC design is assumed to exist prior to start 701.

Before layout, there may be pre-layout tasks 790. For example, if a suitable standard cell library does not already exists, one must be created, or an existing one must be modified, indicated in create analog standard cell library 710. In a mixed-signal SoC design, the standard cell library should comprise both digital standard cells 201 and analog standard cells 202; in a purely analog SoC design, the standard cell library must comprise analog standard cells 202 and optionally digital standard cells 201.

After pre-layout tasks 790, the the SoC design is accessed in read SoC design 711 and the standard cell library is accessed in read standard cell library 712. The SoC design may be in any suitable format, for example a gate-level netlist or a Register Transfer Level (RTL) netlist. Furthermore, this SoC description includes any constraints, annotations, rules, etc. that may be used to aid, guide, or restrict the layout of the circuit, for example timing constraints, transistor drive strengths, or node parasitics.

The row heights 102 are next determined as indicated in determine row heights 713 using any standard conventions in the art. For example, the row heights 102 may be determined by some industry standard, or they may be determined from analysis of the standard cell library.

Once row heights 102 are determined, the SoC design circuits are mapped to digital standard cells 201 and analog standard cells 202. The term functions is used generally to describe circuitry of the SoC design, for example 'digital functions' describes some digital circuitry and 'analog functions' describes some analog circuitry. The flowchart shows a query made in unmapped digital functions? 714, which determines if there is any unmapped digital circuitry in the SoC design. If yes, then zero or more of these digital functions (digital circuitry) are mapped to digital standard cells 201 in map digital functions 715. Similarly, a query is made in unmapped analog functions? 716, which determines if there is any unmapped analog circuitry in the SoC design. If yes, then zero or more of these analog functions (analog circuitry) are mapped to analog standard cells 202 in map analog functions 717. Finally, a query is made in unmapped mixed-signal functions? 718, which determines if there is any unmapped mixed-signal circuitry in the SoC design. If yes, then zero or more of these mixed-signal functions (mixed-signal circuitry) are mapped to digital standard cells 201 and analog standard cells 202 in map mixed-signal functions 719. The option to map "zero or more" digital, analog, and mixed-signal functions in each of the described flowchart steps is intended to demonstrate that there is no fixed order or procedure of mapping digital, analog, and mixed-signal circuitry to standard cells. The mapping order is arbitrary and more precisely, may be accomplished serially, in parallel, or concurrently. Any suitable convention, algorithm, process, or heuristic may be used to determine the specific map circuit to cells 792 strategy. Finally, A query is made in unmapped functions? 720, which determines if there is any unmapped circuitry of any type in the SoC design.

After map circuit to cells 792, the digital standard cells 201 and analog standard cells 202 are placed in rows 101 as indicated in place cells 793. A query is made in unplaced digital cells? 721, which determines if there are any unplaced digital standard cells 201. If yes, then zero or more of these digital standard cells 201 are placed in rows 101 in place digital cells 722. A query is made in unplaced analog cells? 723, which determines if there are any unplaced analog standard cells 202. If yes, then zero or more of these analog standard cells 202 are placed in rows 101 in place analog cells 724. The placement order is arbitrary, and more precisely, may be accomplished serially, in parallel, or concurrently. Any suitable convention, algorithm, process, or heuristic may be used to determine the specific place cells 793 strategy. Finally, A query is made in unplaced cells? 725, which determines if there are any unplaced standard cells of any type.

Once place cells 793 is complete, route interconnects 797 is performed, which includes route power and ground 795 and route signals 794. Although the flowchart shows route power and ground 727 and route signals 726 in that order as is convention in the art, the order is arbitrary, and may be performed serially, in parallel, or concurrently according to any suitable convention, algorithm, process, or heuristic. If the ECAD tool is unable to route all signal, power, and ground lines of the SoC physical design, than an "unroute" failure has occurred, as it is known in the art, as indicated in "unroute" exists? 733. If such failure occurs, then the routing constraints may be modified and/or some existing routed interconnects are unrouted, as indicated in modify constraints or "unroute" 734, and another attempt is made to route the interconnects of the SoC physical design.

An SoC design may specify constraints to be met by the layout (physical design), for example signal timing or node parasitics. These constraints, referred to generally as metrics, may be determined, analyzed, modified, or evaluated in analyze layout metrics 796 in an effort to optimize the physical design. Metrics may be computed, determined, or adjusted in determine layout metrics 728, after which they may be analyzed in evaluate metrics 729 to decide whether they satisfy some specified targets. If these metrics are satisfactory, based on any suitable convention, algorithm, process, or heuristic, then any remaining tasks to complete the layout may be performed in complete layout tasks 732. Examples of remaining layout tasks include insertion of dummy stripes of different fabrication layers to make the density of each layer fall within the ranges specified by Design Rule Checks (DRCs). If however, these metrics are not satisfactory, then the SoC design description, which includes design constraints, annotations, rules, etc. may be modified in modify SoC design 730. This modify SoC design 730 step may also include unmapping, unplacing, and unrouting any or all previously mapped, placed, and routed portions of the SoC design and associated layout. Optionally, the standard cell library may be modified in optionally modify library 731. Example standard cell library modifications include expanding the library to include more digital standard cells 201 and more analog standard cells 202, redesigning some existing digital standard cells 201 or analog standard cells 202, or even replacing the library with an entirely different library. ECAD design flow is then re-entered at read SoC design 711 as indicated, and the mapping, placement, routing, and analysis may again proceed.

Although specific embodiments of the present invention have been illustrated and described, many variations or modifications would be apparent that do not depart from the spirit and scope of the invention, which are defined by the appended claims.

What is claimed is:

1. A semiconductor integrated circuit layout representation stored on non-transitory computer-readable media, when selected for design entry by a Computer-Aided Design tool executed by a computer, lays out an integrated circuit having predetermined
  vertical height,
  horizontal width,
  non-negative integers N, $N_1$, and $N_2$ representing quantities of n-type poly fingers wherein $N \geq N_1 + N_2 \geq 1$, and
  non-negative integers P, $P_1$ and $P_2$ representing quantities of p-type poly fingers wherein $P \geq P_1 + P_2 \geq 1$;
  said integrated circuit comprising:
  N parallel and horizontally separated n-type poly fingers partitioned into a first set of $N_1$ adjacent n-type poly fingers and a mutually exclusive second set of $N_2$ n-type poly fingers;
  P parallel and horizontally separated p-type poly fingers partitioned into a first set of $P_1$ adjacent p-type poly fingers and a mutually exclusive second set of $P_2$ p-type poly fingers;
  N+1 n-type diffusions, one disposed left of the leftmost said n-type poly finger, one disposed right of the rightmost said n-type poly finger, and one disposed between each adjacent pair of said n-type poly fingers;

P+1 p-type diffusions, one disposed left of the leftmost said p-type poly finger, one disposed right of the rightmost said p-type poly finger, and one disposed between each adjacent pair of said p-type poly fingers; and a plurality of electrically conductive segments, wherein
if $N_1 \geq 1$, then a first conductive segment is coupled electrically to said first set of n-type poly fingers,
else if $N_1=0$ then said first conductive segment is omitted;
if $N_2 \geq 1$, then a second conductive segment is coupled electrically to said second set of n-type poly fingers,
else if $N_2=0$ then said second conductive segment is omitted;
if $P_1 \geq 1$, then a third conductive segment is coupled electrically to said first set of p-type poly fingers,
else if $P_1=0$ then said third conductive segment is omitted;
if $P_2 \geq 1$, then a fourth conductive segment is coupled electrically to said second set of p-type poly fingers,
else if $P_2=0$ then said fourth conductive segment is omitted;
if $N_1 \geq 1$, then a fifth conductive segment is coupled electrically to alternating said n-type diffusions that are adjacent to a finger of said first set of n-type poly fingers, beginning with and progressing rightward from the n-type diffusion disposed immediately left of the leftmost finger of said first set of n-type poly fingers and wherein the rightmost electrical coupling is optional when it is to the n-type diffusion disposed between the rightmost finger of said first set of n-type poly fingers and the leftmost finger of said second set of n-type poly fingers,
else if $N_1=0$ then said fifth conductive segment is omitted;
if $N_2 \geq 1$, then a sixth conductive segment is coupled electrically to alternating said n-type diffusions that are adjacent to a finger of said first set of n-type poly fingers, beginning with and progressing leftward from the n-type diffusion disposed immediately right of the rightmost finger of said first set of n-type poly fingers and wherein the leftmost electrical coupling is optional when it is to the n-type diffusion disposed between the rightmost finger of said first set of n-type poly fingers and the leftmost finger of said second set of n-type poly fingers,
else if $N_2=0$ then said sixth conductive segment is omitted;
if $P_1 \geq 1$, then a seventh conductive segment is coupled electrically to alternating said p-type diffusions that are adjacent to a finger of said first set of p-type poly fingers, beginning with and progressing rightward from the p-type diffusion disposed immediately left of the leftmost finger of said first set of p-type poly fingers and wherein the rightmost electrical coupling is optional when it is to the p-type diffusion disposed between the rightmost finger of said first set of p-type poly fingers and the leftmost finger of said second set of p-type poly fingers,
else if $P_1=0$ then said seventh conductive segment is omitted;
if $P_2 \geq 1$, then an eighth conductive segment is coupled electrically to alternating said p-type diffusions that are adjacent to a finger of said first set of p-type poly fingers, beginning with and progressing leftward from the p-type diffusion disposed immediately right of the rightmost finger of said first set of p-type poly fingers and wherein the leftmost electrical coupling is optional when it is to the p-type diffusion disposed between the rightmost finger of said first set of p-type poly fingers and the leftmost finger of said second set of p-type poly fingers,
else if $P_2=0$ then said eighth conductive segment is omitted;
if any said n-type diffusions are not electrically coupled to any aforementioned conductive segment, then a ninth conductive segment is coupled electrically to each said heretofore not electrically coupled n-type diffusion and wherein an electrical coupling is optional when it is to the n-type diffusion disposed between the rightmost finger of said first set of n-type poly fingers and the leftmost finger of said second set of n-type poly fingers,
else if all said n-type diffusions are electrically coupled to any aforementioned conductive segment, then said ninth conductive segment is omitted; and
if any said p-type diffusions are not electrically coupled to any aforementioned conductive segment, then a tenth conductive segment is coupled electrically to each said heretofore not electrically coupled p-type diffusion and wherein an electrical coupling is optional when it is to the p-type diffusion disposed between the rightmost finger of said first set of p-type poly fingers and the leftmost finger of said second set of p-type poly fingers,
else if all said p-type diffusions are electrically coupled to any aforementioned conductive segment, then said tenth conductive segment is omitted.

2. An SoC physical design flow defining one or more layout rows that each have a specified row height, said design flow comprising:
at least one first circuit layout representation of claim 1; and
at least one second semiconductor integrated circuit layout representation stored on non-transitory computer-readable media, wherein
each said first circuit layout representation has cell height equal to one of said row heights or to an integer multiple thereof; and
each said second circuit layout representation has cell height equal to one of said row heights or to an integer multiple thereof; wherein
said design flow can accept as input an SoC circuit design description comprising either or both analog circuits and digital circuits; and
said design flow performs the following tasks:
maps one or more said analog circuits, or portions thereof; to at least one of said first circuit layout representations and optionally to at least one of said second circuit layout representations,
maps one or more said digital circuits, or portions thereof, to at least one of said second circuit layout representations and optionally to at least one of said first circuit layout representations,
said mappings occurring concurrently, serially, or in parallel;
places each said mapped first circuit layout representation within a said layout row that has said row height equal to said cell height or across an integer number of adjacent said layout rows that has total height equal to said cell height,
places each said mapped second circuit layout representation within a said layout row that has said row height equal to said cell height or across an integer number of adjacent said layout rows that has total height equal to said cell height, said placements occurring concurrently, serially, or in parallel; and routes interconnect lines to and from each said mapped first circuit layout representation, routes interconnect lines to and from each said mapped second circuit layout representation, said routings occurring concurrently, serially, or in parallel.

3. A standard cell library, stored on non-transitory computer-readable media, selected for design entry by a Computer-Aided Design tool executed by a computer, said standard cell library comprising at least one description or reference to the circuit layout representation of claim 1.

4. A semiconductor integrated circuit layout representation stored on non-transitory computer-readable media, when selected for design entry by a Computer-Aided Design tool executed by a computer, lays out an integrated circuit having predetermined vertical height, horizontal width, non-negative integers N, $N_1$, and $N_2$ representing quantities of n-type poly fingers wherein $N \geq N_1 + N_2 \geq 1$, and non-negative integers P, $P_1$, and $P_2$ representing quantities of p-type poly fingers wherein $P \geq P_1 + P_2 \geq 1$; said integrated circuit comprising:

N parallel and horizontally separated n-type poly fingers partitioned into a first set of $N_1$ adjacent n-type poly fingers and a mutually exclusive second set of $N_2$ n-type poly fingers;

P parallel and horizontally separated p-type poly fingers partitioned into a first set of $P_1$ adjacent p-type poly fingers and a mutually exclusive second set of $P_2$ p-type poly fingers;

N+1 n-type diffusions, one disposed left of the leftmost said n-type poly finger, one disposed right of the rightmost said n-type poly finger, and one disposed between each adjacent pair of said n-type poly fingers;

P+1 p-type diffusions, one disposed left of the leftmost said p-type poly finger, one disposed right of the rightmost said p-type poly finger, and one disposed between each adjacent pair of said p-type poly fingers; and a plurality of electrically conductive segments, wherein if $N_1 \geq 1$, then a first conductive segment is coupled electrically to said first set of n-type poly fingers, else if $N_1 = 0$ then said first conductive segment is omitted;

if $N_2 \geq 1$, then a second conductive segment is coupled electrically to said second set of n-type poly fingers, else if $N_2 = 0$ then said second conductive segment is omitted;

if $P_1 \geq 1$, then a third conductive segment is coupled electrically to said first set of p-type poly fingers, else if $P_1 = 0$ then said third conductive segment is omitted;

if $P_2 \geq 1$, then a fourth conductive segment is coupled electrically to said second set of p-type poly fingers, else if $P_2 = 0$ then said fourth conductive segment is omitted;

if $N_1 \geq 1$, then a fifth conductive segment is coupled electrically to alternating said n-type diffusions that are adjacent to a finger of said first set of n-type poly fingers, beginning with and progressing rightward from the n-type diffusion disposed immediately left of the leftmost finger of said first set of n-type poly fingers, else if $N_1 = 0$ then said fifth conductive segment is omitted;

if $N_2 \geq 1$, then a sixth conductive segment is coupled electrically to alternating said n-type diffusions that are adjacent to a finger of said first set of n-type poly fingers, beginning with and progressing leftward from the n-type diffusion disposed immediately right of the rightmost finger of said first set of n-type poly fingers, else if $N_2 = 0$ then said sixth conductive segment is omitted;

if $P_1 \geq 1$, then a seventh conductive segment is coupled electrically to alternating said p-type diffusions that are adjacent to a finger of said first set of p-type poly fingers, beginning with and progressing rightward from the n-type diffusion disposed immediately left of the leftmost finger of said first set of p-type poly fingers, else if $P_1 = 0$ then said seventh conductive segment is omitted;

if $P_2 \geq 1$, then an eighth conductive segment is coupled electrically to alternating said p-type diffusions that are adjacent to a finger of said first set of p-type poly fingers, beginning with and progressing leftward from the p-type diffusion disposed immediately right of the rightmost finger of said first set of p-type poly fingers, else if $P_2 = 0$ then said eighth conductive segment is omitted;

if any said n-type diffusions are not electrically coupled to any aforementioned conductive segments, then a ninth conductive segment is coupled electrically to each said heretofore not electrically coupled n-type diffusion, else if all said n-type diffusions are electrically coupled to any aforementioned conductive segment, then said ninth conductive segment is omitted; and if any said p-type diffusions are not electrically coupled to any aforementioned conductive segments, then a tenth conductive segment is coupled electrically to each said heretofore not electrically coupled p-type diffusion, else if all said p-type diffusions are electrically coupled to any aforementioned conductive segment, then said tenth conductive segment is omitted.

5. An SoC physical design flow defining one or more layout rows that each have a specified row height, said design flow comprising:

at least one first circuit layout representation of claim 4; and at least one second semiconductor integrated circuit layout representation stored on non-transitory computer-readable media, wherein each said first circuit layout representation has cell height equal to one of said row heights or to an integer multiple thereof; and each said second circuit layout representation has cell height equal to one of said row heights or to an integer multiple thereof; wherein said design flow can accept as input an SoC circuit design description comprising either or both analog circuits and digital circuits; and said design flow performs the following tasks:

maps one or more said analog circuits, or portions thereof, to at least one of said first circuit layout representations and optionally to at least one of said second circuit layout representations, maps one or more said digital circuits, or portions thereof, to at least one of said second circuit layout representations and optionally to at least one of said first circuit layout representations, said mappings occurring concurrently, serially, or in parallel;

places each said mapped first circuit layout representation within a said layout row that has said row height equal to said cell height or across an integer number of adjacent said layout rows that has total height equal to said cell height, places each said mapped second circuit layout representation within a said layout row that has said row height equal to said cell height or across an integer number of adjacent said layout rows that has total height equal to said cell height, said placements occurring concurrently, serially, or in parallel; and routes interconnect lines to and from each said mapped first circuit layout representation, routes interconnect lines to and from each said mapped second circuit layout representation, said routings occurring concurrently, serially, or in parallel.

6. A standard cell library, stored on non-transitory computer-readable media, selected for design entry by a Computer-Aided Design tool executed by a computer, said standard cell library comprising at least one description or reference to the circuit layout representation of claim 4.

7. A semiconductor integrated circuit layout representation stored on non-transitory computer-readable media, when selected for design entry by a Computer-Aided Design tool executed by a computer, lays out an integrated circuit having predetermined vertical height, horizontal width, non-negative integers N, $N_1$, and $N_2$ representing quantities of n-type poly fingers wherein $N \geq N_1 + N_2 \geq 1$, and non-negative integers P, $P_1$, and $P_2$ representing quantities of p-type poly fingers wherein $P \geq P_1 + P_2 \geq 1$;

said integrated circuit comprising:

N parallel and horizontally separated n-type poly fingers partitioned into a first set of $N_1$ adjacent n-type poly fingers and a mutually exclusive second set of $N_2$ n-type poly fingers;

P>0 P parallel and horizontally separated p-type poly fingers partitioned into a first set of $P_1$ adjacent p-type poly fingers and a mutually exclusive second set of $P_2$ p-type poly fingers;

N+1 n-type diffusions, one disposed left of the leftmost said n-type poly finger, one disposed right of the rightmost said n-type poly finger, and one disposed between each adjacent pair of said n-type poly fingers;

P+1 p-type diffusions, one disposed left of the leftmost said p-type poly finger, one disposed right of the rightmost said p-type poly finger, and one disposed between each adjacent pair of said p-type poly fingers; and a plurality of electrically conductive segments, wherein if $N_1 \geq 1$, then a first conductive segment is coupled electrically to said first set of n-type poly fingers, else if $N_1$ 0 then said first conductive segment is omitted;

if $N_2 \geq 1$, then a second conductive segment is coupled electrically to said second set of n-type poly fingers, else if $N_2 = 0$ then said second conductive segment is omitted;

if $P_1 \geq 1$, then a third conductive segment is coupled electrically to said first set of p-type poly fingers, else if $P_1 = 0$ then said third conductive segment is omitted;

if $P_2 \geq 1$, then a fourth conductive segment is coupled electrically to said second set of p-type poly fingers, else if $P_2 = 0$ then said fourth conductive segment is omitted;

if $N_1 \geq 1$, then a fifth conductive segment is coupled electrically to alternating said n-type diffusions that are adjacent to a finger of said first set of n-type poly fingers, beginning with and progressing rightward from the n-type diffusion disposed immediately left of the leftmost finger of said first set of n-type poly fingers and wherein the rightmost electrical coupling is optional when it is to the n-type diffusion disposed between the rightmost finger of said first set of n-type poly fingers and the leftmost finger of said second set of n-type poly fingers, else if $N_1 = 0$ then said fifth conductive segment is omitted;

if $N_2 \geq 1$, then a sixth conductive segment is coupled electrically to alternating said n-type diffusions that are adjacent to a finger of said first set of n-type poly fingers, beginning with and progressing leftward from the n-type diffusion disposed immediately right of the rightmost finger of said first set of n-type poly fingers and wherein the leftmost electrical coupling is optional when it is to the n-type diffusion disposed between the rightmost finger of said first set of n-type poly fingers and the leftmost finger of said second set of n-type poly fingers, else if $N_2 = 0$ then said sixth conductive segment is omitted;

if $P_1 \geq 1$, then a seventh conductive segment is coupled electrically to alternating said p-type diffusions that are adjacent to a finger of said first set of p-type poly fingers, beginning with and progressing rightward from the p-type diffusion disposed immediately left of the leftmost finger of said first set of p-type poly fingers and wherein the rightmost electrical coupling is optional when it is to the p-type diffusion disposed between the rightmost finger of said first set of p-type poly fingers and the leftmost finger of said second set of p-type poly fingers, else if $P_1 = 0$ then said seventh conductive segment is omitted; and if $P_2 \geq 1$, then an eighth conductive segment is coupled electrically to alternating said p-type diffusions that are adjacent to a finger of said first set of p-type poly fingers, beginning with and progressing leftward from the p-type diffusion disposed immediately right of the rightmost finger of said first set of p-type poly fingers and wherein the leftmost electrical coupling is optional when it is to the p-type diffusion disposed between the rightmost finger of said first set of p-type poly fingers and the leftmost finger of said second set of p-type poly fingers, else if $P_2 = 0$ then said eighth conductive segment is omitted.

8. The integrated circuit of claim 7 wherein:

if any said n-type diffusions are not electrically coupled to any aforementioned conductive segment, then a ninth conductive segment is coupled electrically to each said heretofore not electrically coupled n-type diffusion and wherein an electrical coupling is optional when it is to the n-type diffusion disposed between the rightmost finger of said first set of n-type poly fingers and the leftmost finger of said second set of n-type poly fingers, else if all said n-type diffusions are electrically coupled to any aforementioned conductive segment, then said ninth conductive segment is omitted; and if any said p-type diffusions are not electrically coupled to any aforementioned conductive segment, then a tenth conductive segment is coupled electrically to each said heretofore not electrically coupled p-type diffusion and wherein an electrical coupling is optional when it is to the p-type diffusion disposed between the rightmost finger of said first set of p-type poly fingers and the leftmost finger of said second set of p-type poly fingers, else if all said p-type diffusions are electrically coupled to any aforementioned conductive segment, then said tenth conductive segment is omitted.

9. An SoC physical design flow defining one or more layout rows that each have a specified row height, said design flow comprising:
at least one first circuit layout representation of claim 8; and
at least one second semiconductor integrated circuit layout representation stored on non-transitory computer-readable media, wherein
each said first circuit layout representation has cell height equal to one of said row heights or to an integer multiple thereof; and
each said second circuit layout representation has cell height equal to one of said row heights or to an integer multiple thereof; wherein
said design flow can accept as input an SoC circuit design description comprising either or both analog circuits and digital circuits; and
said design flow performs the following tasks:
maps one or more said analog circuits, or portions thereof, to at least one of said first circuit layout representations and optionally to at least one of said second circuit layout representations,
maps one or more said digital circuits, or portions thereof, to at least one of said second circuit layout representations and optionally to at least one of said first circuit layout representations,
said mappings occurring concurrently, serially, or in parallel;
places each said mapped first circuit layout representation within a said layout row that has said row height equal to said cell height or across an integer number of adjacent said layout rows that has total height equal to said cell height,
places each said mapped second circuit layout representation within a said layout row that has said row height equal to said cell height or across an integer number of adjacent said layout rows that has total height equal to said cell height,
said placements occurring concurrently, serially, or in parallel; and
routes interconnect lines to and from each said mapped first circuit layout representation,
routes interconnect lines to and from each said mapped second circuit layout representation,
said routings occurring concurrently, serially, or in parallel.

10. A standard cell library, stored on non-transitory computer-readable media, selected for design entry by a Computer-Aided Design tool executed by a computer, said standard cell library comprising at least one description or reference to the circuit layout representation of claim 8.

11. An SoC physical design flow defining one or more layout rows that each have a specified row height, said design flow comprising:
at least one first circuit layout representation of claim 7; and
at least one second semiconductor integrated circuit layout representation stored on non-transitory computer-readable media, wherein
each said first circuit layout representation has cell height equal to one of said row heights or to an integer multiple thereof; and
each said second circuit layout representation has cell height equal to one of said row heights or to an integer multiple thereof; wherein
said design flow can accept as input an SoC circuit design description comprising either or both analog circuits and digital circuits; and
said design flow performs the following tasks:
maps one or more said analog circuits, or portions thereof, to at least one of said first circuit layout representations and optionally to at least one of said second circuit layout representations,
maps one or more said digital circuits, or portions thereof, to at least one of said second circuit layout representations and optionally to at least one of said first circuit layout representations,
said mappings occurring concurrently, serially, or in parallel;
places each said mapped first circuit layout representation within a said layout row that has said row height equal to said cell height or across an integer number of adjacent said layout rows that has total height equal to said cell height,
places each said mapped second circuit layout representation within a said layout row that has said row height equal to said cell height or across an integer number of adjacent said layout rows that has total height equal to said cell height,
said placements occurring concurrently, serially, or in parallel; and
routes interconnect lines to and from each said mapped first circuit layout representation,
routes interconnect lines to and from each said mapped second circuit layout representation,
said routings occurring concurrently, serially, or in parallel.

12. A standard cell library, stored on non-transitory computer-readable media, selected for design entry by a Computer-Aided Design tool executed by a computer, said standard cell library comprising at least one description or reference to the circuit layout representation of claim 7.

13. A semiconductor integrated circuit layout representation stored on non-transitory computer-readable media, when selected for design entry by a Computer-Aided Design tool executed by a compute; lays out an integrated circuit having predetermined
vertical height,
horizontal width,
non-negative integers N, $N_1$, and $N_2$ representing quantities of n-type poly fingers wherein $N \geq N_1 + N_2 \geq 1$, and
non-negative integers P, $P_1$, and $P_2$ representing quantities of p-type poly fingers wherein. $P \geq P_1 + P_2 \geq 1$;
said integrated circuit comprising:
N parallel and horizontally separated n-type poly fingers partitioned into a first set of $N_1$ adjacent n-type poly fingers and a mutually exclusive second set of $N_2$ n-type poly fingers;
P parallel and horizontally separated p-type poly fingers partitioned into a first set of $P_1$ adjacent p-type poly fingers and a mutually exclusive second set of $P_2$ p-type poly fingers;
N+1 n-type diffusions, one disposed left of the leftmost said n-type poly finger, one disposed right of the rightmost said n-type poly finger, and one disposed between each adjacent pair of said n-type poly fingers;
P+1 p-type diffusions, one disposed left of the leftmost said p-type poly finger, one disposed right of the rightmost said p-type poly finger, and one disposed between each adjacent pair of said p-type poly fingers; and a plurality of electrically conductive segments, wherein if $N_1 \geq 1$, then a first conductive segment is coupled electrically to said first set of n-type poly fingers, else if $N_1=0$ then said first conductive segment is omitted;

if $N_2 \geq 1$, then a second conductive segment is coupled electrically to said second set of n-type poly fingers, else if $N_2=0$ then said second conductive segment is omitted;

if $P_1 \geq 1$, then a third conductive segment is coupled electrically to said first set of p-type poly fingers, else if $P_1 0$ then said third conductive segment is omitted;

if $P_2 \geq 1$, then a fourth conductive segment is coupled electrically to said second set of p-type poly fingers, else if $P_2=0$ then said fourth conductive segment is omitted;

if $N_1 \geq 1$, then a fifth conductive segment is coupled electrically to alternating said n-type diffusions that are adjacent to a finger of said first set of n-type poly fingers, beginning with and progressing rightward from the n-type diffusion disposed immediately left of the leftmost finger of said first set of n-type poly fingers, else if $N_1=0$ then said fifth conductive segment is omitted;

if $N_2 \geq 1$, then a sixth conductive segment is coupled electrically to alternating said n-type diffusions that are adjacent to a finger of said first set of n-type poly fingers, beginning with and progressing leftward from the n-type diffusion disposed immediately right of the rightmost finger of said first set of n-type poly fingers, else if $N_2=0$ then said sixth conductive segment is omitted;

if $P_1 \geq 1$, then a seventh conductive segment is coupled electrically to alternating said p-type diffusions that are adjacent to a finger of said first set of p-type poly fingers, beginning with and progressing rightward from the n-type diffusion disposed immediately left of the leftmost finger of said first set of p-type poly fingers, else if $P_1=0$ then said seventh conductive segment is omitted; and if $P_2 \geq 1$, then an eighth conductive segment is coupled electrically to alternating said p-type diffusions that are adjacent to a finger of said first set of p-type poly fingers, beginning with and progressing leftward from the p-type diffusion disposed immediately right of the rightmost finger of said first set of p-type poly fingers, else if $P_2=0$ then said eighth conductive segment is omitted.

14. The integrated circuit of claim 13 wherein:

if any said n-type diffusions are not electrically coupled to any aforementioned conductive segments, then a ninth conductive segment is coupled electrically to each said heretofore not electrically coupled n-type diffusion, else if all said n-type diffusions are electrically coupled to any aforementioned conductive segment, then said ninth conductive segment is omitted; and if any said p-type diffusions are not electrically coupled to any aforementioned conductive segments, then a tenth conductive segment is coupled electrically to each said heretofore not electrically coupled p-type diffusion, else if all said p-type diffusions are electrically coupled to any aforementioned conductive segment, then said tenth conductive segment is omitted.

15. An SoC physical design flow defining one or more layout rows that each have a specified row height, said design flow comprising:

at least one first circuit layout representation of claim 14; and at least one second semiconductor integrated circuit layout representation stored on non-transitory computer-readable media, wherein each said first circuit layout representation has cell height equal to one of said row heights or to an integer multiple thereof; and each said second circuit layout representation has cell height equal to one of said row heights or to an integer multiple thereof wherein said design flow can accept as input an SoC circuit design description comprising either or both analog circuits and digital circuits; and said design flow performs the following tasks:

maps one or more said analog circuits, or portions thereof, to at least one of said first circuit layout representations and optionally to at least one of said second circuit layout representations, maps one or more said digital circuits, or portions thereof, to at least one of said second circuit layout representations and optionally to at least one of said first circuit layout representations, said mappings occurring concurrently, serially, or in parallel;

places each said mapped first circuit layout representation within a said layout row that has said row height equal to said cell height or across an integer number of adjacent said layout rows that has total height equal to said cell height, places each said mapped second circuit layout representation within a said layout row that has said row height equal to said cell height or across an integer number of adjacent said layout rows that has total height equal to said cell height, said placements occurring concurrently, serially, or in parallel; and routes interconnect lines to and from each said mapped first circuit layout representation, routes interconnect lines to and from each said mapped second circuit layout representation, said routings occurring concurrently, serially, or in parallel.

16. A standard cell library, stored on non-transitory computer-readable media, selected for design entry by a Computer-Aided Design tool executed by a computer, said standard cell library comprising at least one description or reference to the circuit layout representation of claim 14.

17. An SoC physical design flow defining one or more layout rows that each have a specified row height, said design flow comprising:

at least one first circuit layout representation of claim 13; and at least one second semiconductor integrated circuit layout representation stored on non-transitory computer-readable media, wherein each said first circuit layout representation has cell height equal to one of said row heights or to an integer multiple thereof; and each said second circuit layout representation has cell height equal to one of said row heights or to an integer multiple thereof; wherein said design flow can accept as input an SoC circuit design description comprising either or both analog circuits and digital circuits; and said design flow performs the following tasks:

maps one or more said analog circuits, or portions thereof, to at least one of said first circuit layout representations and optionally to at least one of said second circuit layout representations, maps one or more said digital circuits, or portions thereof, to at least one of said second circuit layout representations and optionally to at least one of said first circuit layout representations, said mappings occurring concurrently, serially, or in parallel;

places each said mapped first circuit layout representation within a said layout row that has said row height equal to said cell height or across an integer number of adjacent said layout rows that has total height equal to said cell height, places each said mapped second circuit layout representation within a said layout row that has said row height equal to said cell height or across an integer number of adjacent said layout rows that has total height equal to said cell height, said placements occurring concurrently, serially, or in parallel; and routes interconnect lines to and from each said mapped first circuit layout representation, routes interconnect lines to and from each said mapped second circuit layout representation, said routings occurring concurrently, serially, or in parallel.

18. A standard cell library, stored on non-transitory computer-readable media, selected for design entry by a Computer-Aided Design tool executed by a computer, said standard cell library comprising at least one description or reference to the circuit layout representation of claim 13.

\* \* \* \* \*